United States Patent
Kim et al.

(10) Patent No.: US 12,424,518 B2
(45) Date of Patent: Sep. 23, 2025

(54) CAPACITOR EMBEDDED 3D RESONATOR FOR BROADBAND FILTER

(71) Applicant: QUALCOMM Incorporated, San Diego, CA (US)

(72) Inventors: Jonghae Kim, San Diego, CA (US); Je-Hsiung Lan, San Diego, CA (US); Kai Liu, Phoenix, AZ (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 880 days.

(21) Appl. No.: 17/682,868

(22) Filed: Feb. 28, 2022

(65) Prior Publication Data

US 2023/0275004 A1 Aug. 31, 2023

(51) Int. Cl.
| | |
|---|---|
| *H01L 23/48* | (2006.01) |
| *H01L 21/768* | (2006.01) |
| *H01L 23/522* | (2006.01) |
| *H03H 7/01* | (2006.01) |

(52) U.S. Cl.
CPC ...... *H01L 23/481* (2013.01); *H01L 21/76898* (2013.01); *H01L 23/5223* (2013.01); *H01L 23/5227* (2013.01); *H03H 7/0115* (2013.01)

(58) Field of Classification Search
CPC ............... H01L 23/481; H01L 23/5223; H01L 23/5227; H01L 21/76898; H01L 28/10; H03H 7/0115; H10D 1/20; H10D 1/60
See application file for complete search history.

(56) References Cited

U.S. PATENT DOCUMENTS

2014/0354378 A1 12/2014 Zuo et al.
2016/0285503 A1* 9/2016 Poulin ............... H04B 1/44
(Continued)

FOREIGN PATENT DOCUMENTS

| CN | 111817677 A | * | 10/2020 |
|---|---|---|---|
| WO | 2017052471 A1 | | 3/2017 |
| WO | 2017147511 A1 | | 8/2017 |

OTHER PUBLICATIONS

Guiller O., et al., "Through Silicon Capacitor Co-integrated with TSVs on Silicon Interposer", Microelectronic Engineering, vol. 120, May 25, 2014, pp. 121-126.
(Continued)

*Primary Examiner* — Joseph C. Nicely
(74) *Attorney, Agent, or Firm* — Seyfarth Shaw LLP

(57) ABSTRACT

An integrated circuit (IC) includes a substrate and a first through substrate via (TSV) in the substrate. The first TSV includes a first metal-insulator-metal (MIM) capacitor. The first MIM capacitor includes a first plate composed of a first metallization layer on an inner surface of the first TSV. The first MIM capacitor includes a MIM insulator layer on the first plate. The first MIM capacitor includes a second plate composed of a second metallization layer on the MIM insulator layer. The IC includes a 3D inductor. The 3D inductor includes a second TSV in the substrate. The 3D inductor includes a first trace on a first surface of the substrate, coupled to a first end of the second TSV. The 3D inductor further includes a second trace on a second surface of the substrate and coupled to a second end of the second TSV and a second end of the first TSV.

18 Claims, 13 Drawing Sheets

(56) References Cited

U.S. PATENT DOCUMENTS

2023/0115796 A1* 4/2023 Zhang .............. H01L 21/76898
257/531
2023/0240009 A1* 7/2023 Takada .................... H05K 1/09

OTHER PUBLICATIONS

International Search Report and Written Opinion—PCT/US2023/010349—ISA/EPO—May 25, 2023.
Lin Y., et al., "Through-Substrate Via (TSV) with Embedded Capacitor as an On-chip Energy Storage Element", 2016 IEEE International 3D Systems Integration Conference (3DIC), IEEE, Nov. 8, 2016, pp. 1-4.

* cited by examiner

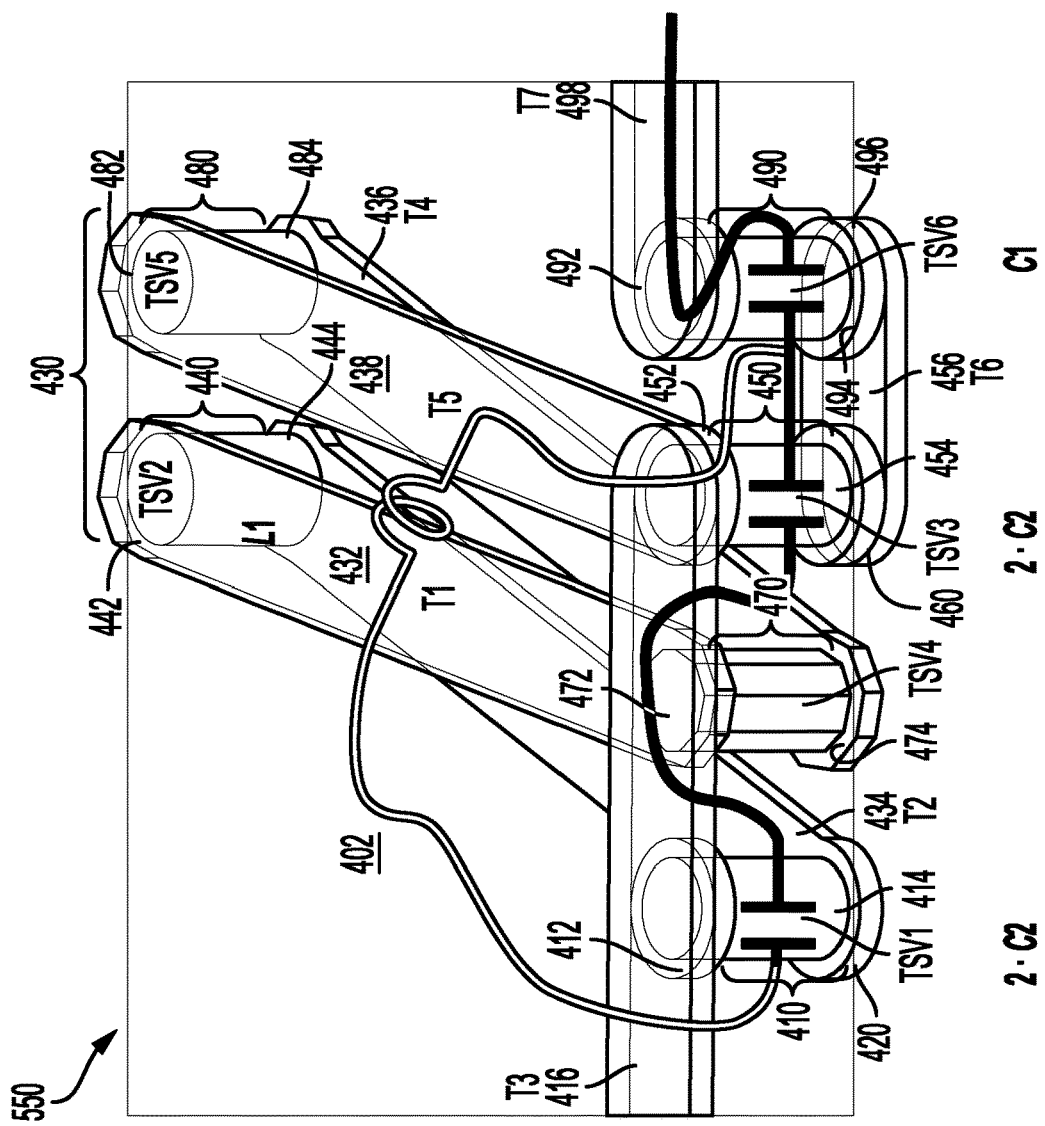
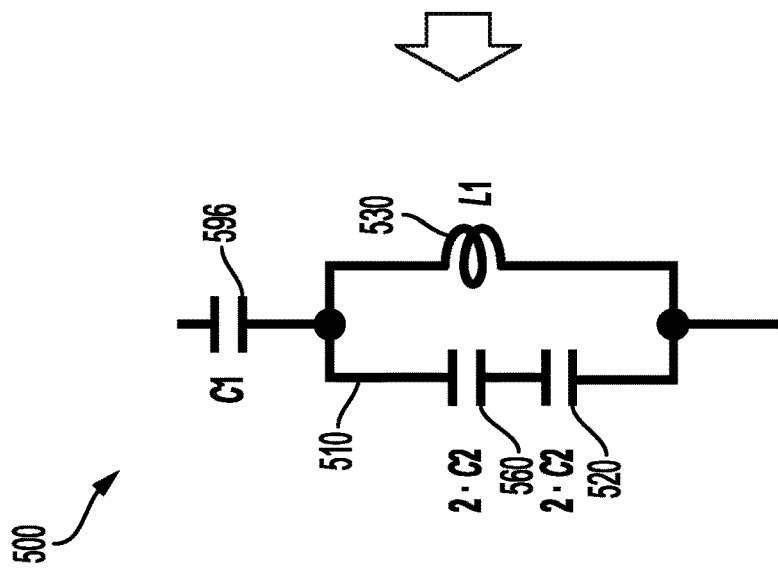
FIG. 5B
FIG. 5A

CAPACITOR EMBEDDED 3D RESONATOR FOR BROADBAND FILTER

BACKGROUND

Field

Aspects of the present disclosure relate to semiconductor devices and, more particularly, to a capacitor embedded 3D resonator for a broadband filter.

Background

Wireless communications devices incorporate radio frequency (RF) modules that facilitate the communication and features users expect. As wireless systems become more prevalent and include more capabilities, the chips become more complex. Fifth generation (5G) new radio (NR) wireless communications devices incorporate the latest generation of electronic dies that are packed into smaller modules with smaller interconnections. Design challenges include using passive devices that directly affect analog RF performance considerations, including mismatch, noise, and RF performance.

Passive devices may involve high performance capacitor and inductor components. For example, analog integrated circuits use various types of passive devices, such as integrated capacitors and inductors. The integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures.

The design of mobile RF transceivers to support 5G NR communications devices involves broadband filters that may be implemented using resonators configured with MIM capacitors and inductors. The communication enhancements specified by 5G NR communications devices involve broadband filters implemented with high-quality (high-Q) resonators, a higher power thermal handling capability, and a smaller die size. Meeting these specifications for implementing broadband filters in 5G NR communications devices may be difficult using 2D inductors as well as conventional MIM capacitors. A high-Q MIM capacitor and a high-Q inductor for implementing a 3D resonator for a broadband filter are desired.

SUMMARY

An integrated circuit (IC) includes a substrate and a first through substrate via (TSV) in the substrate. The first TSV includes a first metal-insulator-metal (MIM) capacitor. The first MIM capacitor includes a first plate composed of a first metallization layer on an inner surface of the first TSV. The first MIM capacitor includes a MIM insulator layer on the first plate. The first MIM capacitor includes a second plate composed of a second metallization layer on the MIM insulator layer. The IC includes a 3D inductor. The 3D inductor includes a second TSV in the substrate. The 3D inductor includes a first trace on a first surface of the substrate, coupled to a first end of the second TSV. The 3D inductor further includes a second trace on a second surface of the substrate and coupled to a second end of the second TSV and a second end of the first TSV.

A method for fabricating a 3D resonator includes depositing a first metallization layer on an inner surface of a first through substrate via (TSV) opening in a substrate as a first plate of a first metal-insulator-metal (MIM) capacitor embedded within the first TSV. The method also includes depositing a dielectric layer on the first plate of the first MIM capacitor. The method further includes depositing a second metallization layer on the dielectric layer as a second plate of the first MIM capacitor. The method also includes forming a second TSV in the substrate. The method further includes depositing a first trace on a first surface of the substrate, coupled to a first end of the second TSV. The method also includes depositing a second trace on a second surface of the substrate, opposite the first surface, coupled to a second end, opposite the first end, of the second TSV and a second end of the first TSV.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 5A and 5B are schematic diagrams further illustrating the cross-type metal-insulator-metal (MIM) capacitors of FIG. 4, according to aspects of the present disclosure.

DETAILED DESCRIPTION

Figure 1:
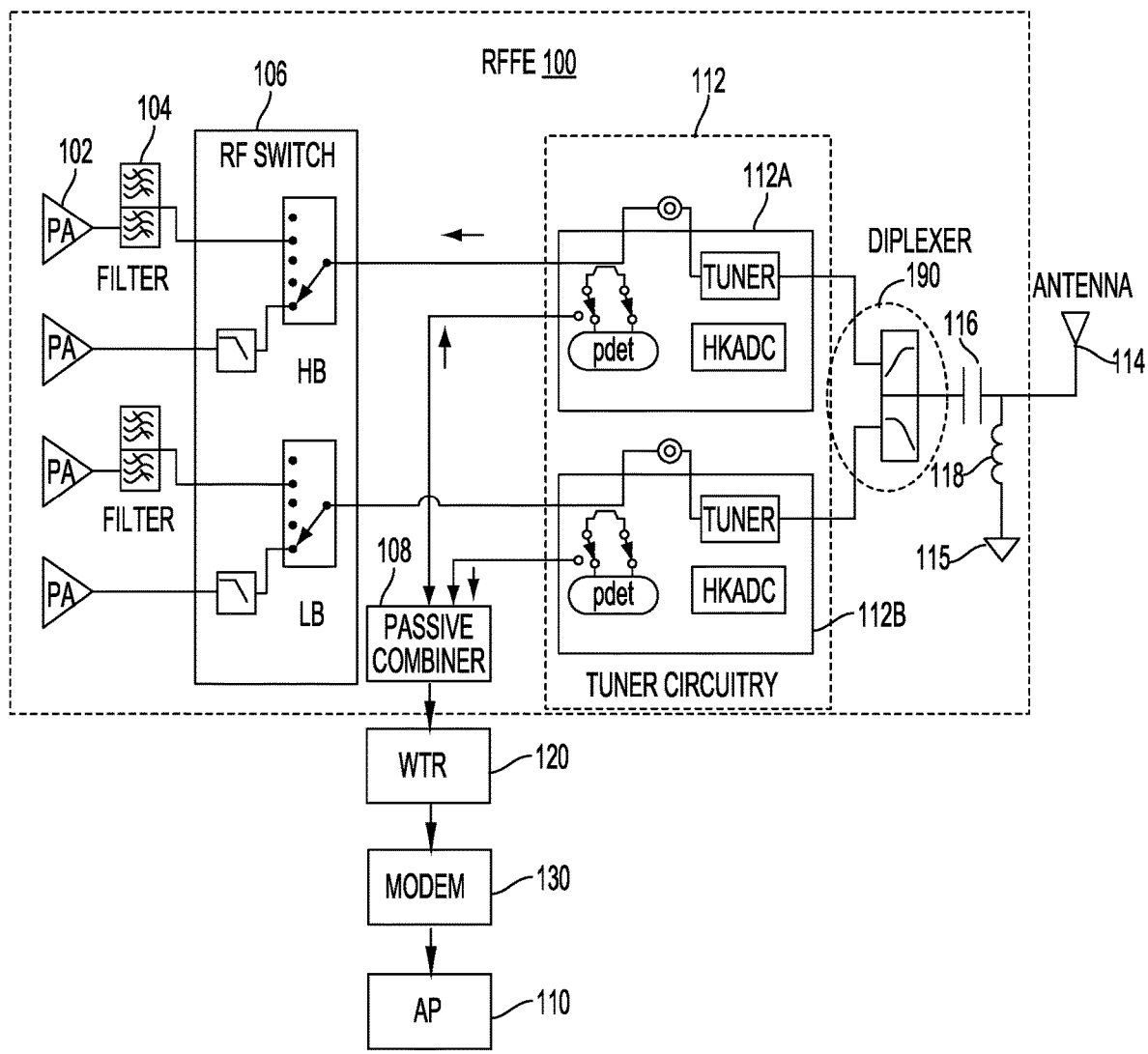
FIG. 1 is a schematic diagram of a radio frequency front-end (RFFE) module employing an integrated passive device (IPD) filter.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers is complicated by added circuit functions for supporting communications enhancements, such as fifth generation (5G) new radio (NR) communications systems. Further design challenges for mobile RF transceivers include using passive devices, which directly affect analog RF performance considerations, including mismatch, noise, and other performance considerations.

Passive devices in mobile radio frequency (RF) transceivers may include high performance capacitor and inductor components. For example, analog integrated circuits use various types of passive devices, such as integrated capacitors and integrated inductors. Integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of broadband filters having inductors and capacitors to meet bandwidth specifications at sub-6 gigahertz frequencies (e.g., frequency range one (FR1)).

A radio frequency front-end (RFFE) module may include a 5G broadband FR1 filter including MIM capacitors and inductors. The design of a 5G broadband FR1 filter may involve the use of a resonator configured with MIM capacitors and inductors. Meeting the bandwidth enhancements specified by 5G NR FR1 involves broadband filters implemented with high-quality (high-Q) resonators, a higher power thermal handling capability, and a smaller die size. Meeting bandwidth enhancements specified by 5G NR FR1 may be difficult using conventional 2D inductors as well as MIM capacitors. A high-Q MIM capacitor and a high-Q inductor for implementing a 3D resonator having a reduced form factor for implementing a 5G broadband FR1 filter are desired.

Various aspects of the disclosure provide a capacitor embedded 3D resonator for a broadband filter. The process flow for fabrication of the capacitor embedded 3D resonator for a broadband filter may include front-end-of-line (FEOL) processes, middle-of-line (MOL) processes, and back-end-of-line (BEOL) processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably.

As described, the back-end-of-line (BEOL) interconnect layers may refer to the conductive interconnect layers (e.g., a first interconnect layer (M1) or metal one M1, metal two (M2), metal three (M3), metal four (M4), etc.) for electrically coupling to front-end-of-line (FEOL) active devices of an integrated circuit. The various BEOL interconnect layers are formed at corresponding BEOL interconnect layers, in which lower BEOL interconnect layers use thinner metal layers relative to upper BEOL interconnect levels. The BEOL interconnect layers may electrically couple to middle-of-line (MOL) interconnect layers, for example, to connect M1 to an oxide diffusion (OD) layer of an integrated circuit. The MOL interconnect layer may include a zero interconnect layer (M0) for connecting M1 to an active device layer of an integrated circuit. A BEOL first via (V2) may connect M2 to M3 or others of the BEOL interconnect layers.

Some aspects of the present disclosure integrate capacitors within through substrate vias (TSVs). For example, the TSVs may be through alumina vias (TAVs) when implemented in an alumina substrate, such as an alumina ribbon ceramic (ARC) substrate to provide improved thermal conductivity (Tσ). In some aspects of the present disclosure, a broadband filter includes a capacitor embedded 3D resonator. For example, the 3D resonator is implemented as an inductor-capacitor (LC) resonator in an interconnect-less configuration. In these aspects of the present disclosure, the 3D resonator exhibits a reduced design form factor by implementing metal-insulator-metal (MIM) capacitors in TSVs.

In some aspects of the present disclosure, a 3D inductor of the 3D resonator is implemented using interconnected TSVs and traces on opposing sides of a substrate. In these aspects of the present disclosure, the traces of the 3D inductor may be coupled to TSV embedded capacitors on either side of the substrate. This configuration provides flexibility in routing RF signal pins whether on a first side or an opposing second side of the substrate through a series connection of the TSV embedded capacitors. A performance of the 3D resonator may be improved when implemented using a high-Q 3D-inductor. These aspects of the present disclosure integrate a 3D resonator (e.g., a capacitor (C) series and LC parallel resonator) for a ladder topology broadband filter.

FIG. 1 is a schematic diagram of a radio frequency front-end (RFFE) module 100 employing a filter 104 (e.g., a broadband filter implemented with a capacitor embedded 3D resonator). The RFFE module 100 includes power amplifiers 102, filter 104, and a radio frequency (RF) switch module 106. The power amplifiers 102 amplify signal(s) to a certain power level for transmission. The filter 104 filters the input/output signals according to a variety of different parameters, including frequency, insertion loss, rejection, or other like parameters. In addition, the RF switch module 106 may select certain portions of the input signals to pass on to the rest of the RFFE module 100.

The radio frequency front-end (RFFE) module 100 also includes tuner circuitry 112 (e.g., first tuner circuitry 112A and second tuner circuitry 112B), the diplexer 190, the capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a housekeeping analog-to-digital converter (HKADC). The tuner circuitry 112 may perform impedance tuning (e.g., a voltage standing wave ratio (VSWR) optimization) for the antenna 114. The RFFE module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 110.

As shown in FIG. 1, the diplexer 190 is between the tuner component of the tuner circuitry 112 and the capacitor 116, the inductor 118, and the antenna 114. The diplexer 190 may be placed between the antenna 114 and the tuner circuitry 112 to provide high system performance from the radio frequency front-end (RFFE) module 100 to a chipset including the wireless transceiver 120, the modem 130, and the application processor 110. The diplexer 190 also performs frequency domain multiplexing on both high band frequencies and low band frequencies. After the diplexer 190 performs its frequency multiplexing functions on the input signals, the output of the diplexer 190 is fed to an optional inductor/capacitor (LC) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
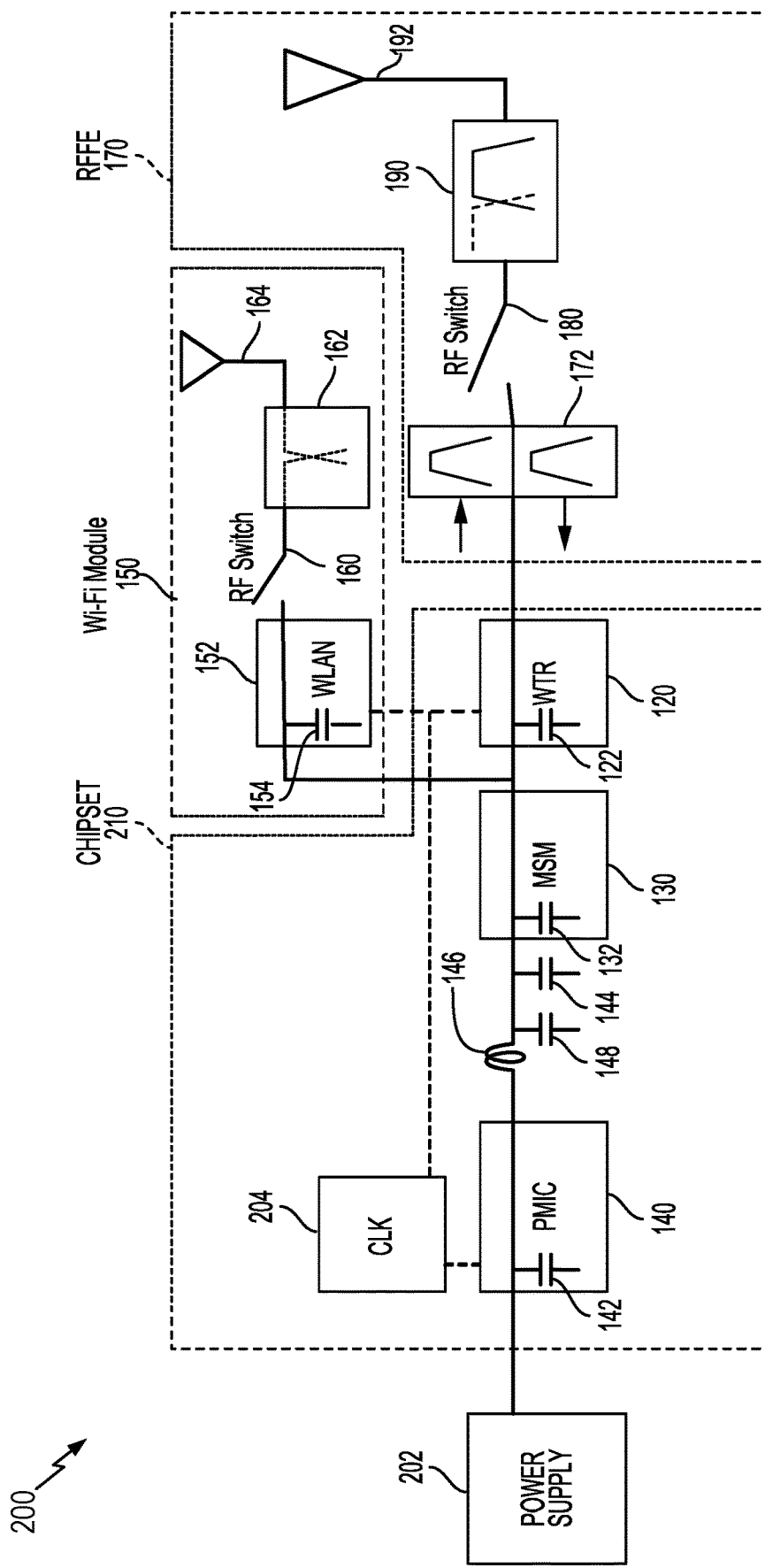
FIG. 2 is a schematic diagram of a radio frequency front-end (RFFE) module employing an integrated passive device (IPD) filter for a chipset.

FIG. 2 is a schematic diagram of a radio frequency integrated circuit (RFIC) chip 200, having a wireless local area network (WLAN) (e.g., Wi-Fi) module 150 and a radio frequency front-end (RFFE) module 170 for a chipset 210. The Wi-Fi module 150 includes a first diplexer 162 communicably coupling an antenna 164 to a WLAN module 152. A first RF switch 160 communicably couples the first diplexer 162 to the WLAN module 152. The RFFE module 170 includes a second diplexer 190 communicably coupling an antenna 192 to a wireless transceiver (WTR) 120 through a filter 172 (e.g., a broadband filter implemented with a capacitor embedded 3D resonator). A second RF switch 180 communicably couples the second diplexer 190 to the filter 172.

The WTR 120 and the WLAN module 152 of the Wi-Fi module 150 are coupled to a modem (mobile station modem (MSM), e.g., baseband modem) 130 that is powered by a power supply 202 through a power management integrated circuit (PMIC) 140. The chipset 210 also includes capacitors 144 and 148, as well as an inductor(s) 146 to provide signal integrity. The PMIC 140, the modem 130, the WTR 120, and the WLAN module 152 each include capacitors (e.g., 142, 132, 122, and 154) and operate according to a clock 204. In addition, the inductor 146 couples the modem 130 to the PMIC 140. The geometry and arrangement of the various inductor and capacitor components in the RFIC) chip 200 may reduce the electromagnetic coupling between the components. The design of the RFFE module 170 includes the filter 172, which may be a broadband filter implemented with a capacitor embedded 3D resonator, for example, as shown in FIG. 3, according to aspects of the present disclosure.

Figure 3:
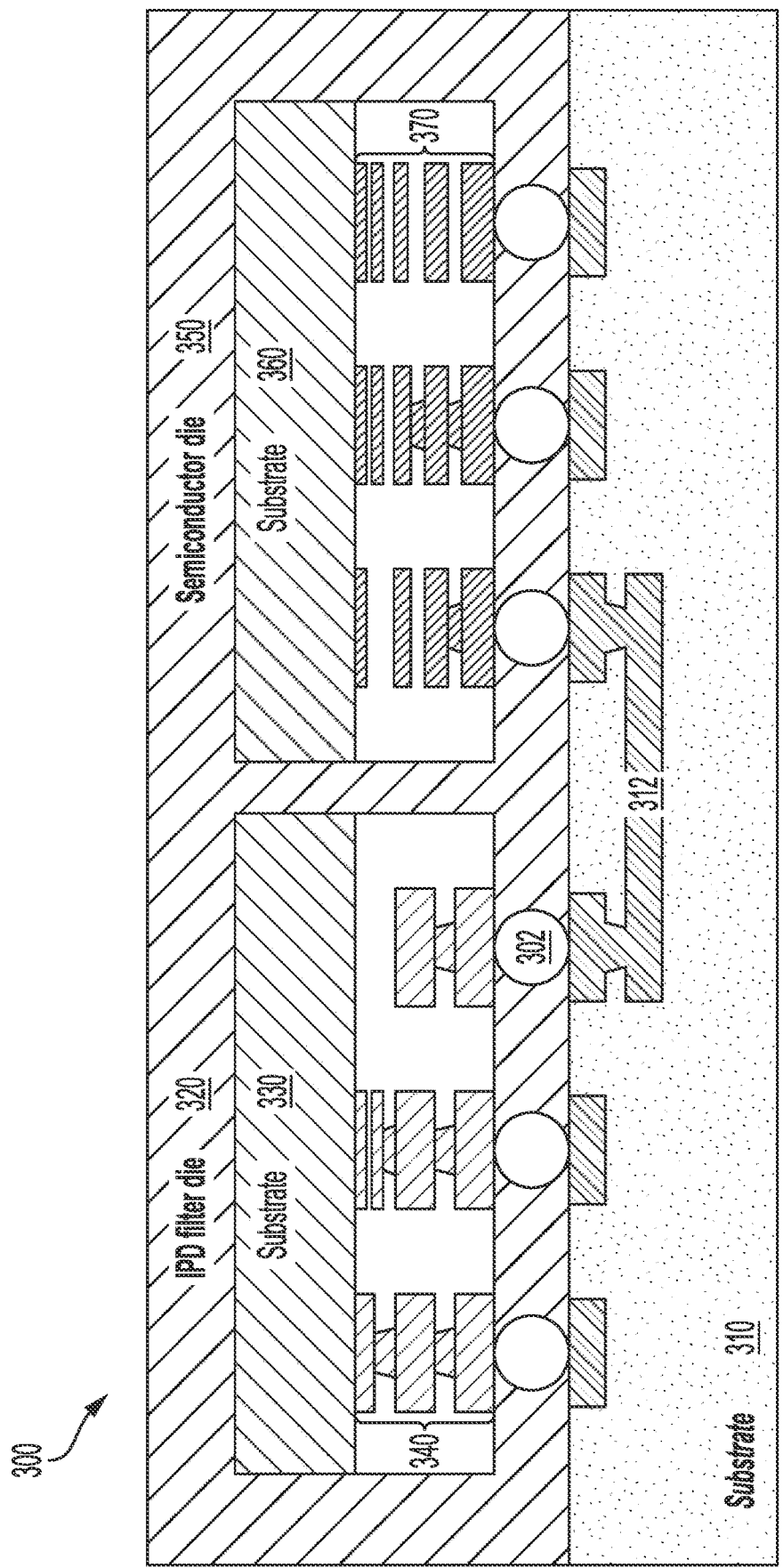
FIG. 3 is a block diagram illustrating a cross-sectional view of a radio frequency front-end (RFFE) module including a semiconductor die and an integrated passive device (IPD) filter die, in accordance with aspects of the present disclosure.

FIG. 3 is a block diagram illustrating a cross-sectional view of a radio frequency front-end (RFFE) module 300, including a semiconductor die and an integrated passive device (IPD) filter die, in accordance with aspects of the present disclosure. In this example, the RFFE module 300 includes a semiconductor die 350 and an IPD filter die 320 supported by a substrate 310. The semiconductor die 350 may be an active die having a semiconductor substrate 360 (e.g., an active silicon substrate) coupled to package balls 302 through back-end-of-line (BEOL) layers 370. The BEOL layers 370 include multiple BEOL metallization layers (M1, M2, M3, . . . , Mn) on the semiconductor substrate 360 (e.g., a diced silicon wafer). A redistribution layer 312 is coupled to the package balls 302.

The IPD filter die 320 includes a substrate 330 (e.g., a passive substrate) coupled to the package balls 302 through back-end-of-line (BEOL) layers 340. The redistribution layer 312 is coupled to the IPD filter die 320 through the package balls 302. In some aspects of the present disclosure, the substrate 330 is composed of glass, and the IPD filter die 320 is a glass-substrate integrated passive device (GIPD) filter die. The IPD filter die 320 may implement a fifth generation (5G) new radio (NR) broadband frequency range one (FR1) filter.

The design of a 5G broadband FR1 filter may involve the use of a resonator configured with metal-insulator-metal (MIM) capacitors and inductors. Meeting the bandwidth enhancements specified by 5G NR FR1 involves broadband filters implemented with high-quality (high-Q) resonators, a higher power thermal handling capability, and a smaller die size. Meeting these bandwidth enhancements specified by 5G NR FR1 may be difficult using conventional 2D inductors as well as MIM capacitors. Aspects of the present disclosure are directed to high-Q MIM capacitors and a high-Q inductor for implementing a 3D resonator having a reduced form factor for implementing a 5G broadband FR1 filter. In some aspects of the present disclosure, the IPD filter die 320 includes a capacitor embedded 3D resonator for a broadband filter, as further illustrated in FIG. 4.

Figure 4:
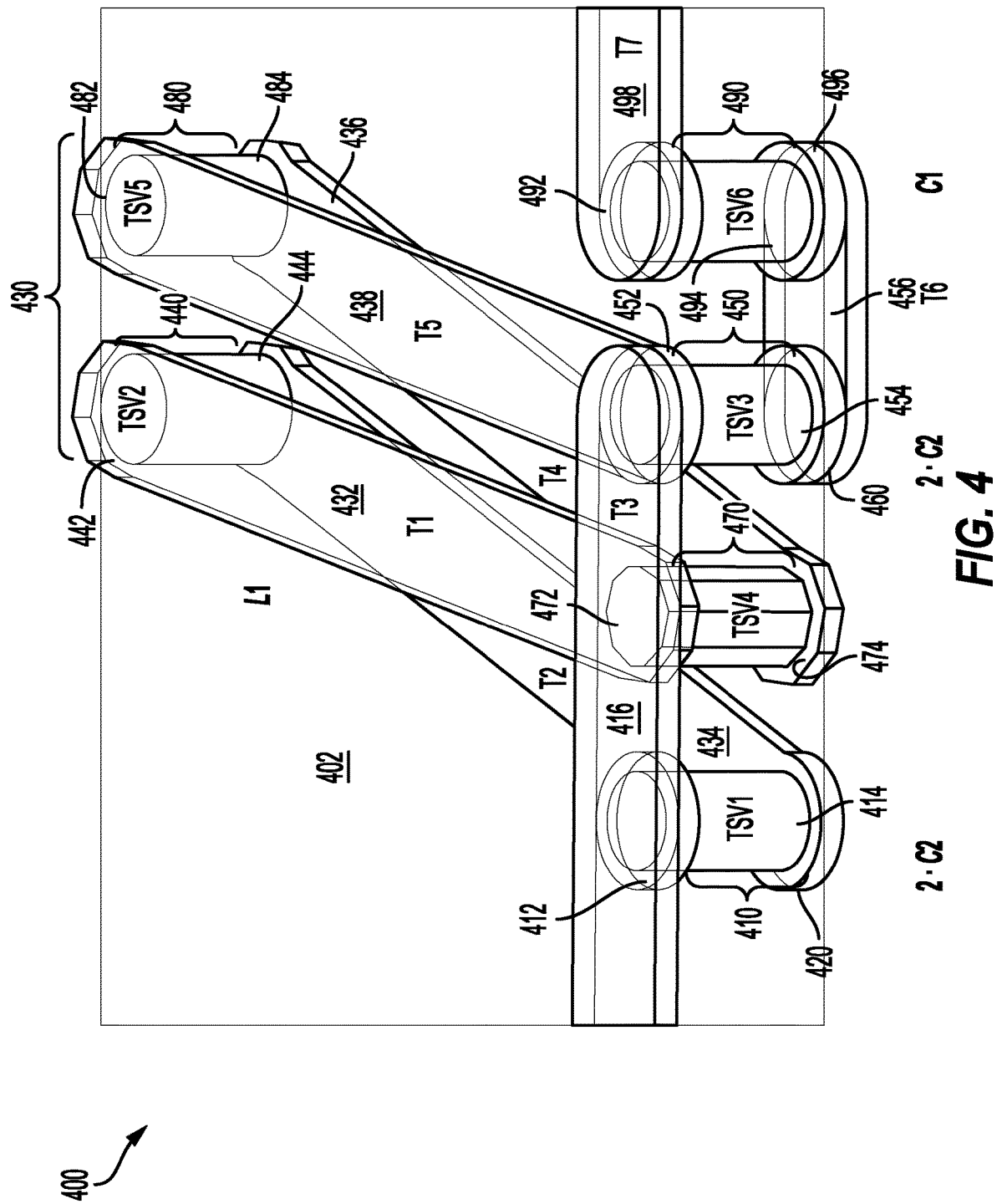
FIG. 4 is a diagram illustrating a radio frequency integrated circuit (RFIC) chip including a capacitor embedded 3D resonator for a broadband filter, according to aspects of the present disclosure.

FIG. 4 is a diagram illustrating a radio frequency integrated circuit (RFIC) chip including a capacitor embedded 3D resonator for a broadband filter, according to aspects of the present disclosure. Representatively, an RFIC chip 400 includes a substrate 402 and a first through substrate via (TSV) 410 in the substrate 402. In some aspects of the present disclosure, the first TSV 410 includes a first metal-insulator-metal (MIM) capacitor 420 embedded within the first TSV 410. In this example, the first MIM capacitor 420 includes a first plate composed of a metallization layer on an inner surface of the first TSV 410. The first MIM capacitor 420 also includes a MIM insulator layer on the first plate of the first MIM capacitor 420. In addition, a second plate of the first MIM capacitor 420 is composed of the metallization layer on the MIM insulator layer. Formation of the first MIM capacitor 420 is further illustrated in FIGS. 6A-6I.

Referring again to FIG. 4, the RFIC chip 400 includes a 3D inductor 430 coupled to the first MIM capacitor 420 embedded within the first TSV 410, according to aspects of the present disclosure. In this example, the 3D inductor 430 includes a second TSV 440 in the substrate 402. The 3D inductor 430 is composed of a first trace 432 on a first surface of the substrate 402 and coupled to a first end 442 of the second TSV 440. The 3D inductor 430 is also composed of a second trace 434 on a second surface of the substrate 402, opposite the first surface of the substrate 402. In this example, the second trace 434 is coupled to a second end 444, opposite the first end 442, of the second TSV 440. In some aspects of the present disclosure, the second trace 434 is coupled to a second end of the first TSV 410, which contacts the 3D inductor 430 to the first MIM capacitor 420.

The RFIC chip 400 further includes a third TSV 450 in the substrate 402 and having a second MIM capacitor 460 embedded in the third TSV 450. In this example, the second MIM capacitor 460 is composed of a first plate composed of the metallization layer on an inner surface of the third TSV 450. The second MIM capacitor 460 also includes a MIM insulator layer on the first plate and a second plate composed of the metallization layer on the MIM insulator layer. The RFIC chip 400 also includes a third trace 416 on the first surface of the substrate 402 coupled to a first end 412 of the first TSV 410 and a first end 452 of the third TSV 450. In these aspects of the present disclosure, the third trace 416 couples the second MIM capacitor 460 to the first MIM capacitor 420 embedded in the first TSV 410.

As further illustrated in FIG. 4, the 3D inductor 430 includes a fourth TSV 470 in the substrate 402 and having a first end 452 coupled to the first trace 432. The 3D inductor 430 also includes a fourth trace 436 on the second surface of the substrate 402. In this example, the fourth trace 436 couples to a second end 474, opposite the first end 472, of the fourth TSV 470. The 3D inductor 430 further includes a fifth TSV 480 in the substrate 402 and having a second end 484 coupled to the fourth trace 436. The 3D inductor 430 also includes a fifth trace 438 on the first surface of the substrate 402 to couple a first end 482 of the fifth TSV 480 and the first end 452 of the third TSV 450. The fifth trace 438 completes formation of the 3D inductor 430 by coupling to the first end 482 of the fifth TSV 480 and the first end 452 of the third TSV 450, which is also coupled to the first TSV 410 through the third trace 416.

The RFIC chip 400 further includes a sixth TSV 490 in the substrate 402, in which a third MIM capacitor 496 is embedded within the sixth TSV 490. In this example, the third MIM capacitor 496 has a first plate composed of the metallization layer on an inner surface of the sixth TSV 490. The third MIM capacitor 496 also includes a MIM insulator layer on the first plate, and a second plate composed of the metallization layer on the MIM insulator layer. The RFIC chip 400 further includes a sixth trace 456 on the second surface of the substrate 402 and coupled to a second end 454 of the third TSV 450 and a second end 494 of the sixth TSV 490. In addition, a seventh trace 498 is coupled to a first end 492 of the sixth TSV 490. In these aspects of the present disclosure, the sixth trace 456 provide a series connection between the second MIM capacitor 460 and the third MIM capacitor 496.

FIGS. 5A and 5B are schematic diagrams of a C-series inductor/capacitor (LC) parallel resonator, according to aspects of the present disclosure. FIG. 5A illustrates a schematic diagram of a C-series LC parallel resonator 500 to enable formation of a broadband filter, such as a fifth generation (5G) new radio (NR) frequency range one (FR1) broadband filter. In this example, a first capacitor 520 and a second capacitor 560 are coupled in series and parallel to an inductor 530 to form an LC circuit 510. In addition, a third capacitor 596 is coupled to the LC circuit 510 to form the C-series LC parallel resonator 500.

FIG. 5B illustrates a capacitor embedded 3D resonator 550 composed of the RFIC chip 400 of FIG. 4, overlaid with the C-series LC parallel resonator 500 of FIG. 5A, according to aspects of the present disclosure. In this example, the 3D inductor 430 is coupled between the first metal-insulator-metal (MIM) capacitor 420, the second MIM capacitor 460 and the series coupled, third MIM capacitor 496 to form the C-series LC parallel resonator 500 of FIG. 5A. In some aspects of the present disclosure, the C-series LC parallel resonator 500 of FIG. 5A is configured as a 3D resonator implemented using interconnected, capacitor embedded through substrate vias (TSVs) (e.g., 410, 450, and 490) and traces (e.g., 432, 434, 436, and 438) on opposing sides of the substrate 402.

In these aspects of the present disclosure, the traces (e.g., 432, 434, 436, and 438) of the 3D inductor 430 may be coupled to the TSV embedded capacitors (e.g., 410, 450, and 490) on either side of the substrate 402. This configuration provides flexibility in routing RF signal pins whether on a first side or an opposing second side of the substrate 402 through a series connection of the TSV embedded capacitors (e.g., 410, 450, and 490). A performance of a capacitor embedded 3D resonator is improved by implementing the 3D inductor 430 using a high-Q 3D-inductor. These aspects of the present disclosure integrate a 3D resonator (e.g., a capacitor (C) series and LC parallel resonator) for a ladder topology broadband filter, for example, as formed in FIGS. 6A-6I.

Figure 6A:
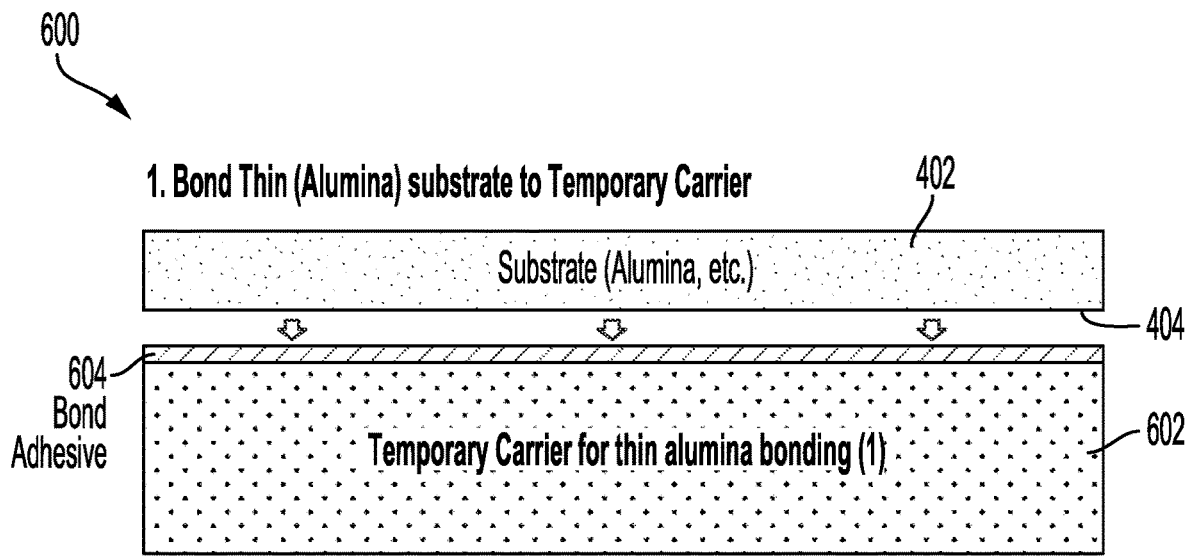
FIGS. 6A to 6I are diagrams further illustrating side views of the cross-type metal-insulator-metal (MIM) capacitors of FIG. 4 in different interconnection schemes, according to aspects of the present disclosure.

FIGS. 6A to 6I are diagrams illustrating a process 600 of fabricating a capacitor embedded 3D resonator, according to aspects of the present disclosure. FIGS. 6A to 6I may use similar reference numbers to the reference numbers of the RFIC chip 400, as shown in FIG. 4. FIG. 6A illustrates step 1 of the process 600, in which a first surface 404 of the substrate 402 is bonded to a first carrier substrate 602 using a first bonding adhesive 604. In this example, the substrate 402 is shown as an alumina substrate, such as an alumina ribbon ceramic (ARC) substrate, or other like substrate material having a desired thermal conductivity.

Figure 6B:
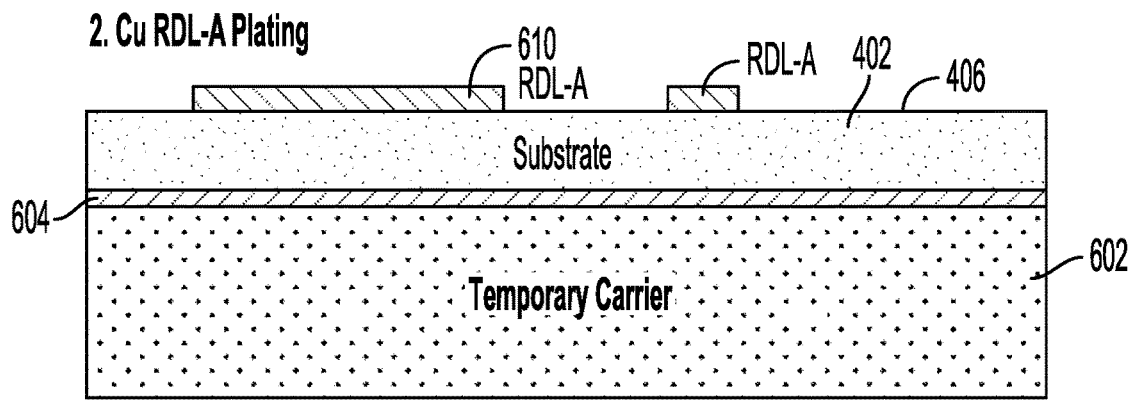

FIG. 6B is a diagram illustrating step 2 of the process 600, in which initial conductive layers 610 are plated on a second surface 406 of the substrate 402. In this example, plating of the initial conductive layers 610 is performed by plating copper (Cu) as an initial redistribution layer (RDL-A) on the second surface 406 of the substrate 402.

Figure 6C:
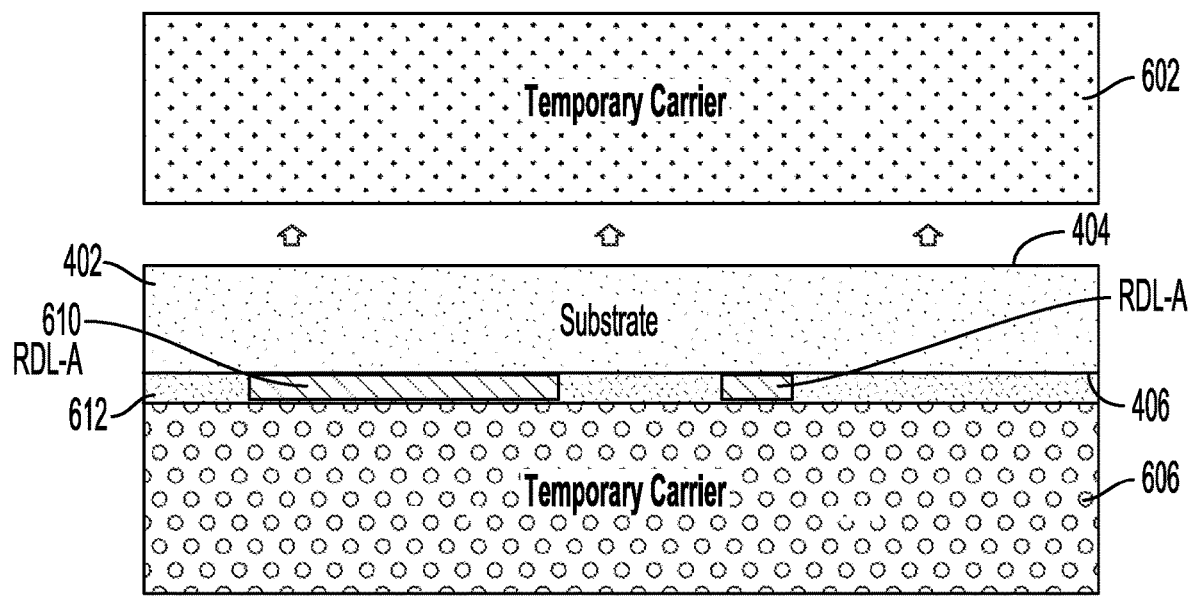

FIG. 6C is a diagram illustrating step 3 of the process 600, in which the first carrier substrate 602 is de-bonded from the first surface 404 of the substrate 402. In addition, a second carrier substrate 606 is bonded to the second surface 406 of the substrate 402, including the initial conductive layers 610 using a second bonding adhesive 612.

Figure 6D:
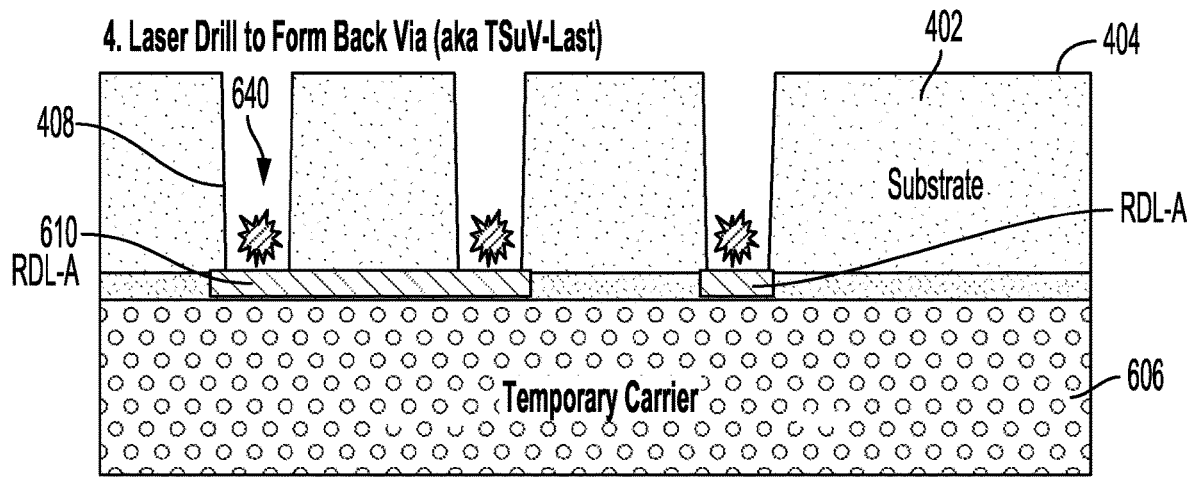

FIG. 6D is a diagram illustrating step 4 of the process 600, in which via openings 640 are formed in the substrate 402 to expose the initial conductive layers 610. In this example, laser drilling is performed to form back vias according to a TSV-last process to expose inner surfaces 408 of the via openings 640 as well as the initial conductive layers 610.

Figure 6E:
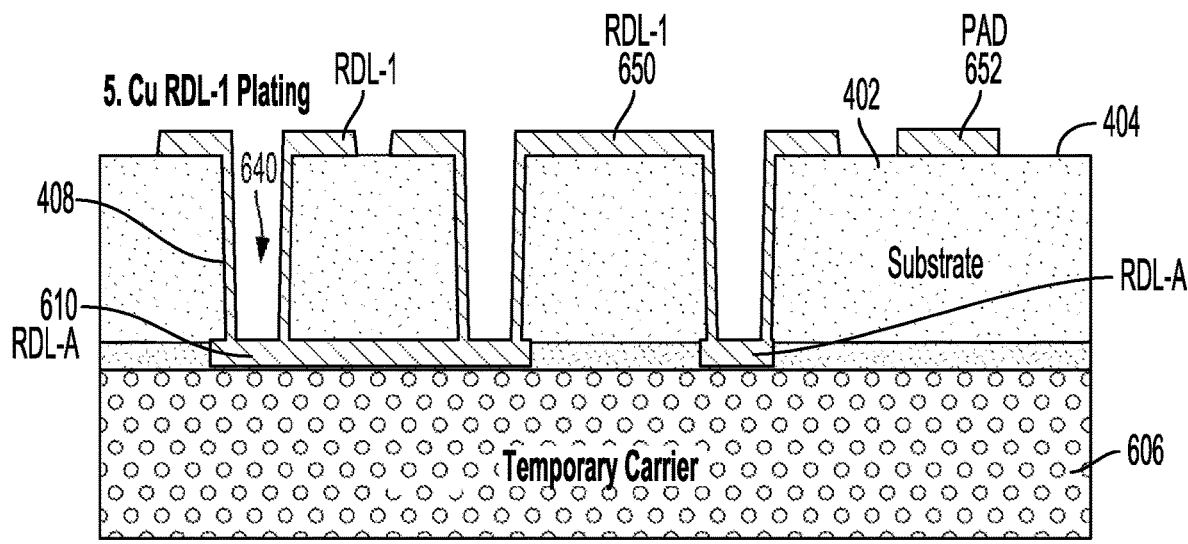

FIG. 6E is a diagram illustrating step 5 of the process 600, in which first conductive layers 650 are plated on the first surface 404 of the substrate 402 and the inner surfaces 408 of the via openings 640. In this example, plating of the first conductive layers 650 is performed by plating copper (Cu) as a first redistribution layer (RDL-1) on the first surface 404 of the substrate 402. Plating of the first conductive layers 650 may also include formation of a first pad 652. In some aspects of the present disclosure, the first conductive layers 650 provide a first plate of through substrate via (TSV) embedded metal-insulator-metal (MIM) capacitors (e.g., 420, 460, and 496), for example, as shown in FIG. 4.

Figure 6F:
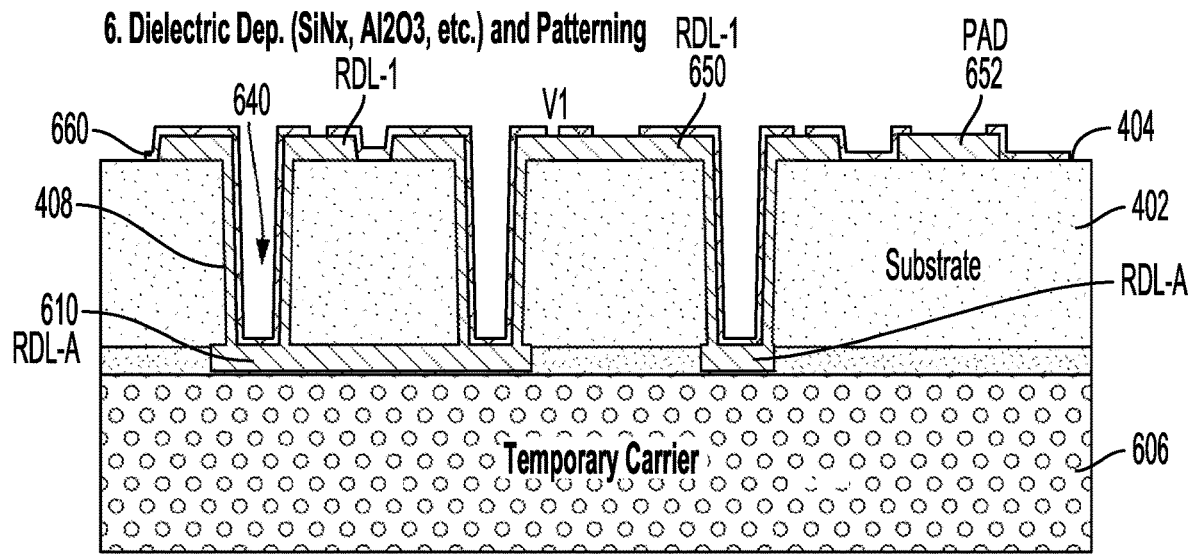

FIG. 6F is a diagram illustrating step 6 of the process 600, in which dielectric layers 660 are deposited on the first conductive layers 650, including the first pad 652. A patterning process is then performed on the dielectric layers 660 to expose portions of the first conductive layers 650 and the first pad 652. In this example, depositing of the dielectric layers 660 may be performed using plasma enhanced chemical vapor deposition (PECVD) of silicon nitride (SiNx) on the first conductive layers 650 and the first pad 652. Alternatively, depositing of the dielectric layers 660 may be performed using plasma atomic layer deposition (ALD) of aluminum oxide ($Al_2O_3$) on the first conductive layers 650 and the first pad 652, or other like dielectric material to support a high-Q capacitor. In some aspects of the present disclosure, the dielectric layers 660 provide an insulator layer of TSV embedded MIM capacitors (e.g., 420, 460, and 496), for example, as shown in FIG. 4.

Figure 6G:
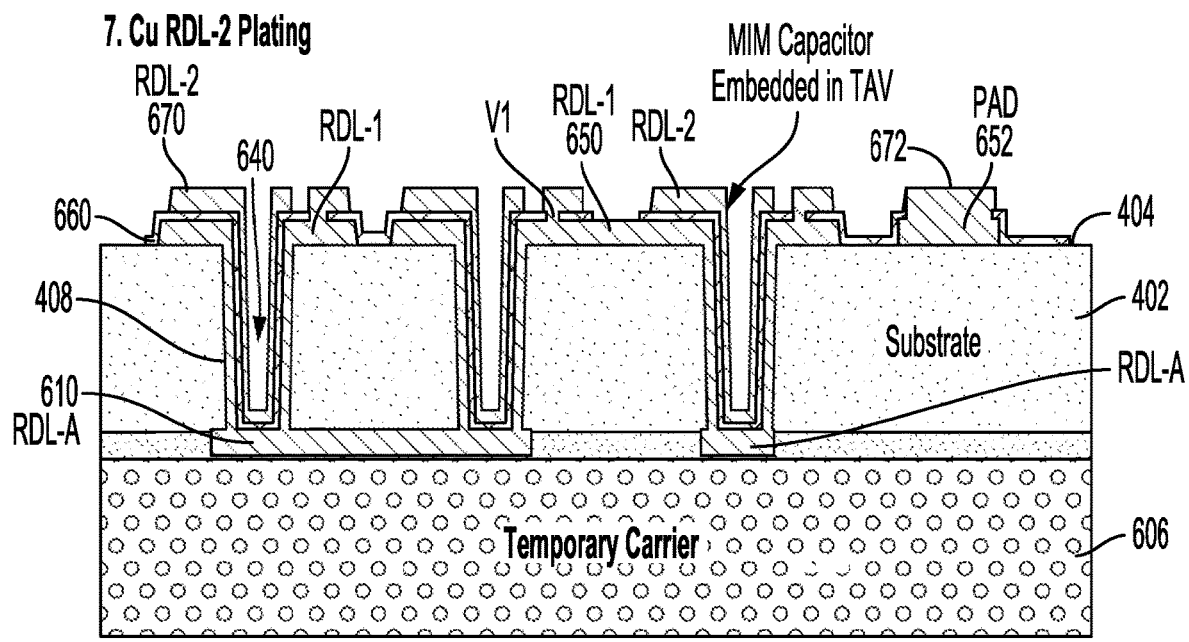

FIG. 6G is a diagram illustrating step 7 of the process 600, in which second conductive layers 670 are plated on the dielectric layers 660 and exposed portions of the first conductive layers 650 and the first pad 652. In this example, plating of the second conductive layers 670 is performed by plating copper (Cu) as a second redistribution layer (RDL-2) on a surface of the dielectric layers 660 and the first conductive layers 650. Plating of the second conductive layers 670 may also include formation of a first via (V1) and a second pad 672 on the first pad 652. In some aspects of the present disclosure, the second conductive layers 670 provide a second plate of TSV embedded MIM capacitors (e.g., 420, 460, and 496), for example, as shown in FIG. 4.

Figure 6H:
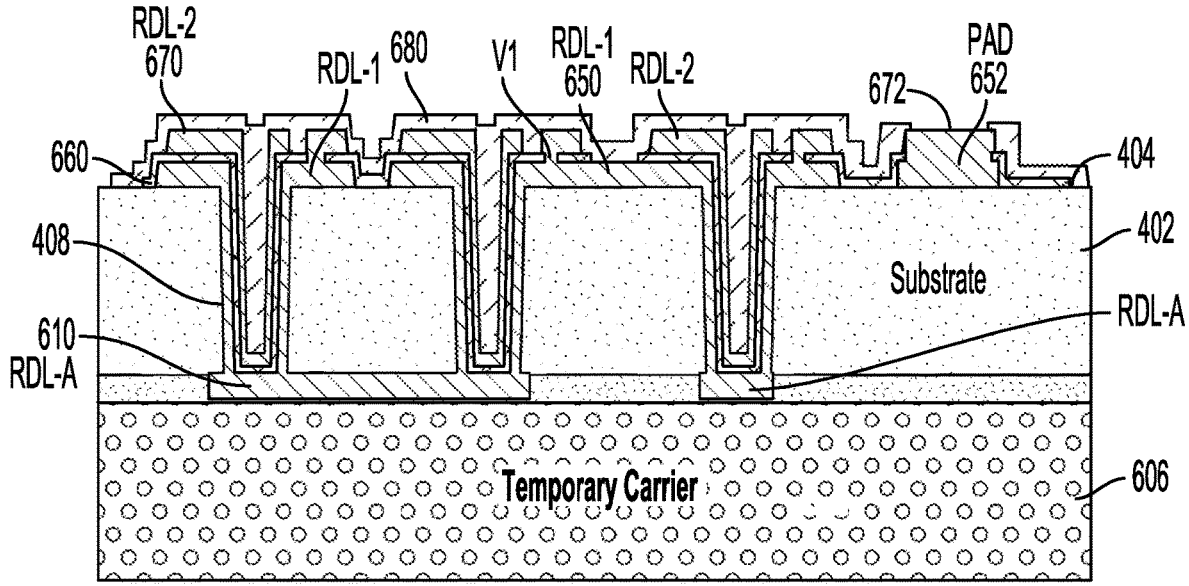

FIG. 6H is a diagram illustrating step 8 of the process 600, in which dry film fill layers 680 are deposited on the second conductive layers 670 and exposed portions of the dielectric layers 660, the first conductive layers 650 and the first surface 404 of the substrate 402. A pad opening process is then performed to expose the second pad 672.

Figure 6I:
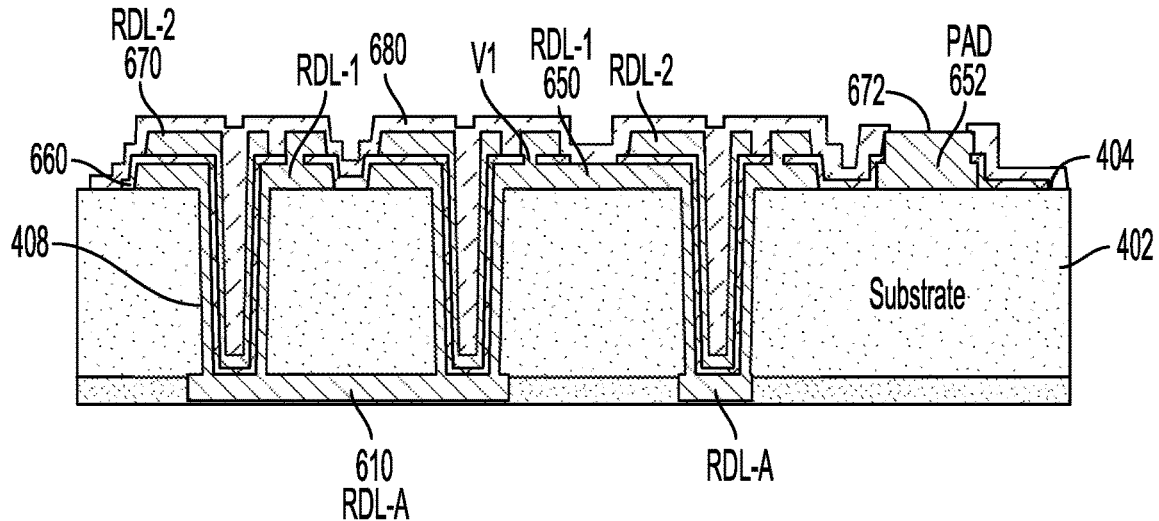

FIG. 6I is a diagram illustrating step 9 of the process 600, in which the second carrier substrate 606 is de-bonded from the substrate 402 to complete the embedded capacitor in 3D TSV inductor/resonator process flow. A process for fabrication of a capacitor embedded 3D resonator is shown, for example, in FIG. 7.

Figure 7:
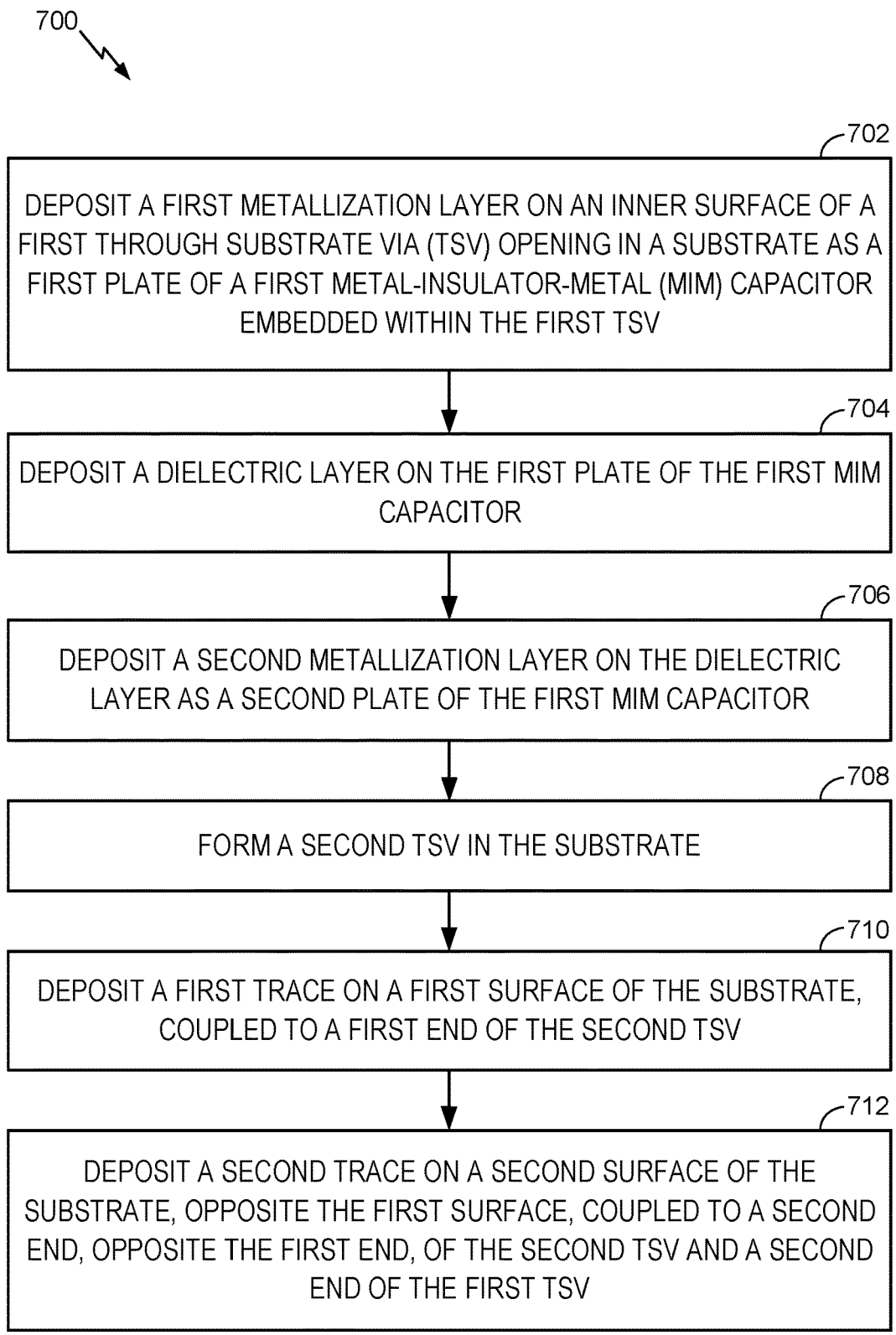
FIG. 7 is a process flow diagram illustrating a method for fabricating a cross-type metal-insulator-metal (MIM) capacitor, according to aspects of the present disclosure.

FIG. 7 is a process flow diagram illustrating a method for fabricating a 3D resonator, according to aspects of the present disclosure. A method 700 begins in block 702, in which a first metallization layer is deposited on an inner surface of a first through substrate via (TSV) opening in a substrate as a first plate of a first metal-insulator-metal (MIM) capacitor embedded within the first TSV. For example, as shown in FIG. 4, the first MIM capacitor 420 includes a first plate composed of a metallization layer on an inner surface of the first TSV 410. As shown in FIG. 6E, first conductive layers 650 are plated on the first surface 404 of the substrate 402 and the inner surfaces 408 of the via openings 640. In this example, plating of the first conductive layers 650 is performed by plating copper (Cu) as a first redistribution layer (RDL-1) on the first surface 404 of the substrate 402 and the inner surfaces 408 of the via openings 640.

In block 704, a dielectric layer is deposited on the first plate of the first MIM capacitor. As shown in FIG. 4, the first MIM capacitor 420 also includes a MIM insulator layer on the first plate of the first MIM capacitor 420. As shown in FIG. 6F, dielectric layers 660 are deposited on the first conductive layers 650, including the first pad 652. A patterning process is then performed on the dielectric layers 660 to expose portions of the first conductive layers 650 and the first pad 652. In this example, depositing of the dielectric layers 660 may be performed using plasma enhanced chemical vapor deposition (PECVD) of silicon nitride (SiNx) on the first conductive layers 650 and the first pad 652. Alternatively, depositing of the dielectric layers 660 may be performed using plasma atomic layer deposition (ALD) of aluminum oxide ($Al_2O_3$) on the first conductive layers 650 and the first pad 652.

Referring again to FIG. 7, at block 706, a second metallization layer is deposited on the dielectric layer as a second plate of the first MIM capacitor. For example, as shown in FIG. 4, a second plate of the first MIM capacitor 420 is composed of the metallization layer on the MIM insulator layer. As shown in FIG. 6G, second conductive layers 670 are plated on the dielectric layers 660 and exposed portions of the first conductive layers 650 and the first pad 652. In this example, plating of the second conductive layers 670 is performed by plating copper (Cu) as a second redistribution layer (RDL-2) on a surface of the dielectric layers 660 and the first conductive layers 650. In some aspects of the present disclosure, the second conductive layers 670 provide a second plate of TSV embedded MIM capacitors (e.g., 420, 460, and 496), for example, as shown in FIG. 4.

At block 708, a second TSV is formed in the substrate. For example, as shown in FIG. 4, the 3D inductor 430 includes a second TSV 440 in the substrate 402. At block 710, a first trace is deposited on a first surface of the substrate, coupled to a first end of the second TSV. For example, as shown in FIG. 4, the 3D inductor 430 is composed of a first trace 432 on a first surface of the substrate 402 and coupled to a first end 442 of the second TSV 440.

At block 712, a second trace is deposited on a second surface of the substrate, opposite the first surface, coupled to a second end, opposite the first end, of the second TSV and a second end of the first TSV. For example, as shown in FIG. 4, the 3D inductor 430 is also composed of a second trace 434 on a second surface of the substrate 402, opposite the first surface of the substrate 402. In this example, the second trace 434 is coupled to a second end 444, opposite the first end 442, of the second TSV 440. In some aspects of the present disclosure, the second trace 434 is coupled to a second end of the first TSV 410, which contacts the 3D inductor 430 to the first MIM capacitor 420.

In some aspects of the present disclosure, a 3D inductor of the 3D resonator is implemented using interconnected TSVs and traces on opposing sides of a substrate. In these aspects of the present disclosure, the traces of the 3D inductor may be coupled to TSV embedded capacitors on either side of the substrate. This configuration provides flexibility in routing RF signal pins whether on a first side or an opposing second side of the substrate through a series connection of the TSV embedded capacitors. A performance of the 3D resonator may be improved when implemented using a high-Q 3D-inductor. These aspects of the present disclosure integrate a 3D resonator (e.g., a capacitor (C) series and an inductor/capacitor (LC) parallel resonator) for a ladder topology broadband filter.

According to a further aspect of the present disclosure, an integrated circuit (IC) includes a first TSV. In one configuration, the first TSV has means for storing charge. In one configuration, the charge storing means may be the first MIM capacitor 420, as shown in FIG. 4. In another aspect, the aforementioned means may be any structure or any material configured to perform the functions recited by the aforementioned means.

Figure 8:
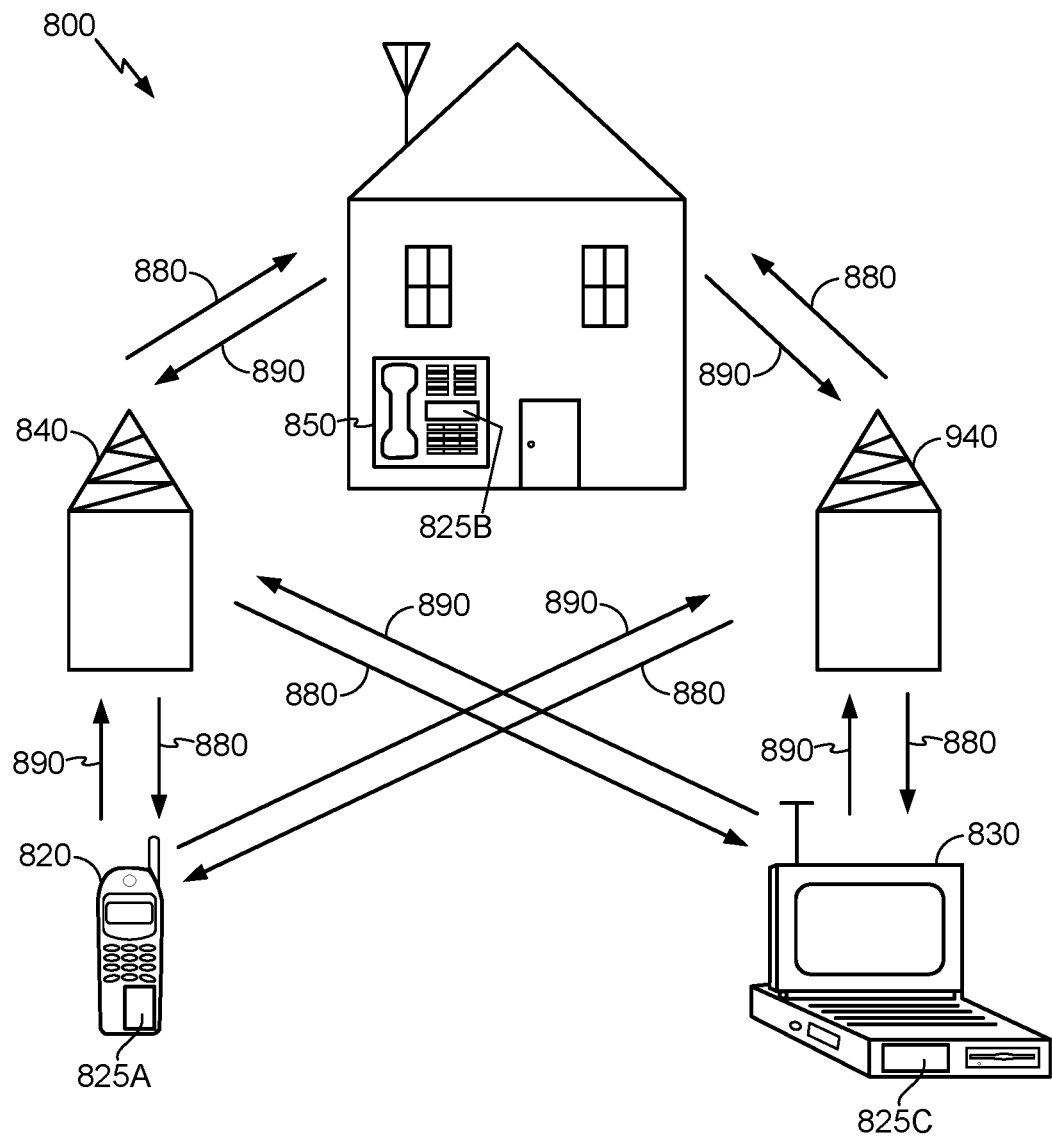
FIG. 8 is a block diagram showing an exemplary wireless communications system in which a configuration of the present disclosure may be advantageously employed.

FIG. 8 is a block diagram showing an exemplary wireless communications system 800 in which an aspect of the disclosure may be advantageously employed. For purposes of illustration, FIG. 8 shows three remote units 820, 830, and 850 and two base stations 840. It will be recognized that wireless communications systems may have many more remote units and base stations. Remote units 820, 830, and 850 include integrated circuit (IC) devices 825A, 825C, and 825B that include the disclosed capacitor embedded 3D resonator. It will be recognized that other devices may also include the disclosed capacitor embedded 3D resonator, such as the base stations, switching devices, and network equipment. FIG. 8 shows forward link signals 880 from the base station 840 to the remote units 820, 830, and 850, and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 8 illustrates remote units according to the aspects of the present disclosure, the present disclosure is not limited to these exemplary illustrated units. Aspects of the present disclosure may be suitably employed in many devices, which include the disclosed capacitor embedded 3D resonator.

Figure 9:
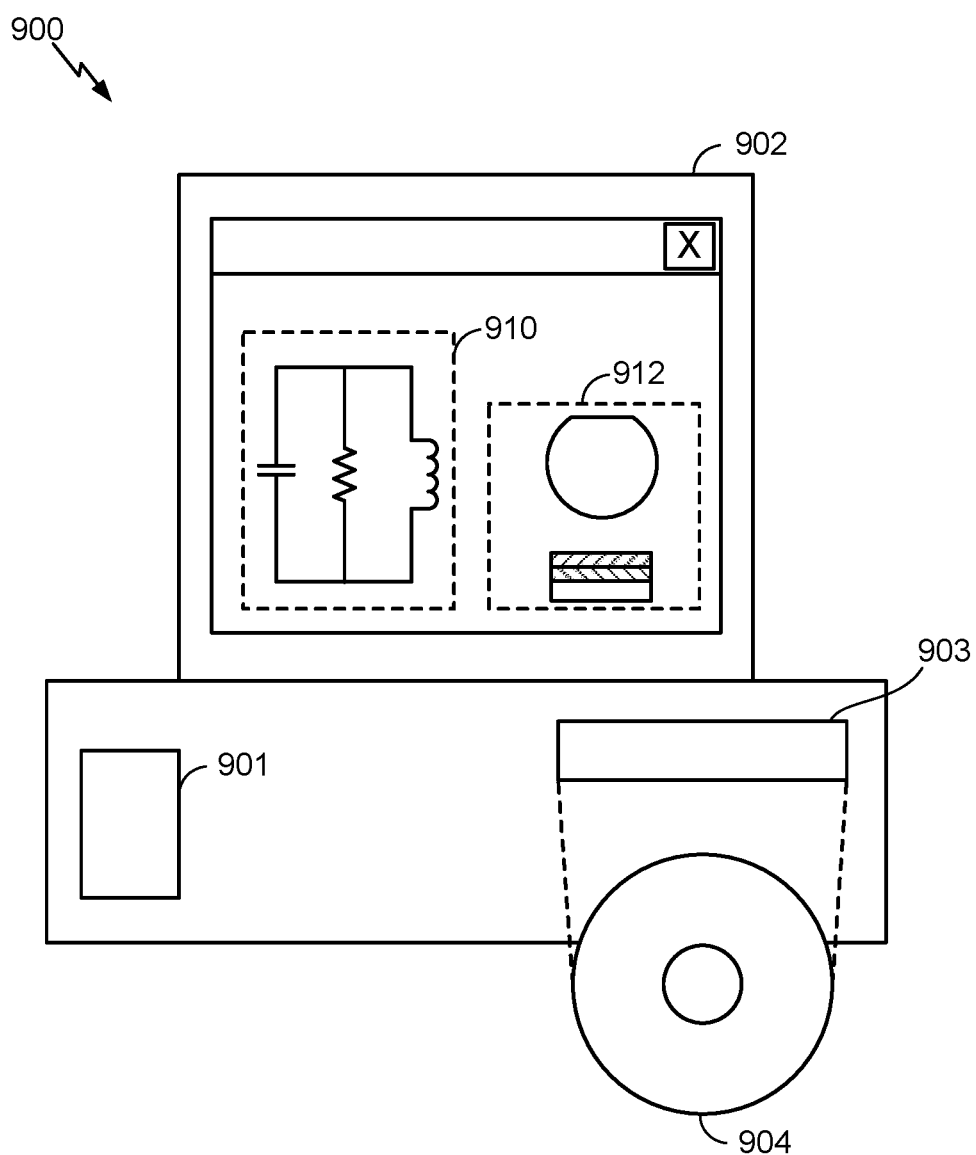
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the capacitor embedded 3D resonator disclosed above. A design workstation 900 includes a hard disk 901 containing operating system software, support files, and design software such as Cadence or OrCAD. The design workstation 900 also includes a display 902 to facilitate design of a circuit 910 or a radio frequency (RF) component 912 such as a cross-type capacitor. A storage medium 904 is provided for tangibly storing the design of the circuit 910 or the RF component 912 (e.g., the capacitor embedded 3D resonator). The design of the circuit 910 or the RF component 912 may be stored on the storage medium 904 in a file format such as GDSII or GERBER. The storage medium 904 may be a compact disc read-only memory (CD-ROM), digital versatile disc (DVD), hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the radio frequency (RF) component 912 by decreasing the number of processes for designing semiconductor wafers.

Implementation examples are described in the following numbered clauses:

1. An integrated circuit (IC), comprising:
    a substrate;
    a first through substrate via (TSV) in the substrate, the first TSV comprising:
        a first metal-insulator-metal (MIM) capacitor comprising:
            a first plate composed of a first metallization layer on an inner surface of the first TSV,
            a MIM insulator layer on the first plate, and
            a second plate composed of a second metallization layer on the MIM insulator layer; and
    a 3D inductor comprising:
        a second TSV in the substrate,
        a first trace on a first surface of the substrate, coupled to a first end of the second TSV, and
        a second trace on a second surface of the substrate, opposite the first surface, coupled to a second end, opposite the first end, of the second TSV and a second end of the first TSV.

2. The IC of clause 1, further comprising:
    a third TSV in the substrate, the third TSV comprising:
        a second MIM capacitor comprising:
            a third plate composed of the first metallization layer on an inner surface of the third TSV,
            the MIM insulator layer on the third plate, and
            a fourth plate composed of the second metallization layer on the MIM insulator layer; and
    a third trace on the first surface of the substrate and coupled to a first end of the first TSV and a first end of the third TSV.

3. The IC of clause 2, in which the 3D inductor further comprises:
    a fourth TSV in the substrate and having a first end coupled to the first trace;
    a fourth trace on the second surface of the substrate, the fourth trace coupled to a second end of the fourth TSV;
    a fifth TSV in the substrate having a second end coupled to the fourth trace; and
    a fifth trace on the first surface of the substrate and coupled to a first end of the fifth TSV and the first end of the third TSV.

4. The IC of clause 3, further comprising:
    a sixth TSV in the substrate, the sixth TSV comprising:
        a third MIM capacitor comprising:
            a fifth plate composed of the first metallization layer on an inner surface of the sixth TSV,
            the MIM insulator layer on the fifth plate, and
            a sixth plate composed of the second metallization layer on the MIM insulator layer; and a sixth trace on the second surface of the substrate and coupled to a second end of the third TSV and a second end of the sixth TSV.

5. The IC of clause 4, further comprising a seventh trace on the first surface of the substrate and coupled to a first end of the sixth TSV.

6. The IC of any of clauses 2-5, in which the first trace is coupled to the first end of the third TSV and the third trace.

7 The IC of any of clauses 1-6, in which the substrate comprises alumina.

8. The IC of any of clauses 1-7, in which the IC is integrated in an integrated passive device (IPD).

9. The IC of clause 8, in which the IPD is integrated in a broadband filter.

10. The IC of clause 9, in which the broadband filter is integrated in a radio frequency front-end (RFFE) module.

11. A method for fabricating a 3D resonator, comprising:
depositing a first metallization layer on an inner surface of a first through substrate via (TSV) opening in a substrate as a first plate of a first metal-insulator-metal (MIM) capacitor embedded within the first TSV;
depositing a dielectric layer on the first plate of the first MIM capacitor;
depositing a second metallization layer on the dielectric layer as a second plate of the first MIM capacitor;
forming a second TSV in the substrate;
depositing a first trace on a first surface of the substrate, coupled to a first end of the second TSV; and
depositing a second trace on a second surface of the substrate, opposite the first surface, coupled to a second end, opposite the first end, of the second TSV and a second end of the first TSV.

12. The method of clause 11, further comprising:
depositing the first metallization layer on an inner surface of a third TSV opening in the substrate as a first plate of a second MIM capacitor embedded within the third TSV;
depositing the dielectric layer on the first plate of the second MIM capacitor;
depositing the second metallization layer on the dielectric layer as a second plate of the second MIM capacitor; and
depositing a third trace on the first surface of the substrate and coupled to a first end of the first TSV and a first end of the third TSV.

13. The method of clause 12, further comprising:
forming a fourth TSV in the substrate and having a first end coupled to the first trace;
depositing a fourth trace on the second surface of the substrate, the fourth trace coupled to a second end of the fourth TSV;
forming a fifth TSV in the substrate having a second end coupled to the fourth trace; and
forming a fifth trace on the first surface of the substrate and coupled to a first end of the fifth TSV and the first end of the third TSV.

14. The method of clause 13, further comprising:
depositing the first metallization layer on an inner surface of a sixth TSV opening in the substrate as a first plate of a third MIM capacitor embedded in the sixth TSV;
depositing the dielectric layer on the first plate of the third MIM capacitor;
depositing the second metallization layer on the dielectric layer as a second plate of the third MIM capacitor; and
depositing a sixth trace on the second surface of the substrate and coupled to a second end of the third TSV and a second end of the sixth TSV.

15. The method of clause 14, further comprising depositing a seventh trace on the first surface of the substrate and coupled to a first end of the sixth TSV.

16. The method of any of clauses 12-15, in which the first trace is coupled to the first end of the third TSV and the third trace.

17. The method of any of clauses 11-16, in which the substrate comprises alumina.

18. The method of any of clauses 11-17, further comprising integrating the 3D resonator in an integrated passive device (IPD).

19. The method of clause 18, further comprising integrating the IPD in a broadband filter.

20. The method of clause 19, further comprising integrating the broadband filter in a radio frequency front-end (RFFE) module.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function, or achieve substantially the same result as the corresponding configurations described herein, may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

The previous description of the present disclosure is provided to enable any person skilled in the art to make or use the disclosure. Various modifications to the present disclosure will be readily apparent to those skilled in the art, and the generic principles defined herein may be applied to other variations without departing from the spirit or scope of the disclosure. Thus, the present disclosure is not intended to be limited to the examples and designs described herein but is to be accorded the widest scope consistent with the principles and novel features disclosed herein.

What is claimed is:

1. An integrated circuit (IC), comprising:
 a substrate;
 a first through substrate via (TSV) in the substrate, the first TSV comprising:
  a first metal-insulator-metal (MIM) capacitor comprising:
   a first plate composed of a first metallization layer on an inner surface of the first TSV,
   a MIM insulator layer on the first plate, and
   a second plate composed of a second metallization layer on the MIM insulator layer;
 a 3D inductor comprising:
  a second TSV in the substrate,
  a first trace on a first surface of the substrate, coupled to a first end of the second TSV, and
  a second trace on a second surface of the substrate, opposite the first surface, coupled to a second end, opposite the first end, of the second TSV and a second end of the first TSV;
 a third TSV in the substrate, the third TSV comprising:
  a second MIM capacitor comprising:

a third plate composed of the first metallization layer on an inner surface of the third TSV,
the MIM insulator layer on the third plate, and
a fourth plate composed of the second metallization layer on the MIM insulator layer; and
a third trace on the first surface of the substrate and coupled to a first end of the first TSV and a first end of the third TSV.

2. The IC of claim 1, in which the 3D inductor further comprises:
a fourth TSV in the substrate and having a first end coupled to the first trace;
a fourth trace on the second surface of the substrate, the fourth trace coupled to a second end of the fourth TSV;
a fifth TSV in the substrate having a second end coupled to the fourth trace; and
a fifth trace on the first surface of the substrate and coupled to a first end of the fifth TSV and the first end of the third TSV.

3. The IC of claim 2, further comprising:
a sixth TSV in the substrate, the sixth TSV comprising:
a third MIM capacitor comprising:
a fifth plate composed of the first metallization layer on an inner surface of the sixth TSV,
the MIM insulator layer on the fifth plate, and
a sixth plate composed of the second metallization layer on the MIM insulator layer; and
a sixth trace on the second surface of the substrate and coupled to a second end of the third TSV and a second end of the sixth TSV.

4. The IC of claim 3, further comprising a seventh trace on the first surface of the substrate and coupled to a first end of the sixth TSV.

5. The IC of claim 1, in which the first trace is coupled to the first end of the third TSV and the third trace.

6. The IC of claim 1, in which the substrate comprises alumina.

7. The IC of claim 1, in which the IC is integrated in an integrated passive device (IPD).

8. The IC of claim 7, in which the IPD is integrated in a broadband filter.

9. The IC of claim 8, in which the broadband filter is integrated in a radio frequency front-end (RFFE) module.

10. A method for fabricating a 3D resonator, comprising:
depositing a first metallization layer on an inner surface of a first through substrate via (TSV) opening in a substrate as a first plate of a first metal-insulator-metal (MIM) capacitor embedded within the first TSV;
depositing a dielectric layer on the first plate of the first MIM capacitor;
depositing a second metallization layer on the dielectric layer as a second plate of the first MIM capacitor;
forming a second TSV in the substrate;
depositing a first trace on a first surface of the substrate, coupled to a first end of the second TSV;
depositing a second trace on a second surface of the substrate, opposite the first surface, coupled to a second end, opposite the first end, of the second TSV and a second end of the first TSV;
depositing the first metallization layer on an inner surface of a third TSV opening in the substrate as a first plate of a second MIM capacitor embedded within the third TSV;
depositing the dielectric layer on the first plate of the second MIM capacitor;
depositing the second metallization layer on the dielectric layer as a second plate of the second MIM capacitor; and
depositing a third trace on the first surface of the substrate and coupled to a first end of the first TSV and a first end of the third TSV.

11. The method of claim 10, further comprising:
forming a fourth TSV in the substrate and having a first end coupled to the first trace;
depositing a fourth trace on the second surface of the substrate, the fourth trace coupled to a second end of the fourth TSV;
forming a fifth TSV in the substrate having a second end coupled to the fourth trace; and
forming a fifth trace on the first surface of the substrate and coupled to a first end of the fifth TSV and the first end of the third TSV.

12. The method of claim 11, further comprising:
depositing the first metallization layer on an inner surface of a sixth TSV opening in the substrate as a first plate of a third MIM capacitor embedded in the sixth TSV;
depositing the dielectric layer on the first plate of the third MIM capacitor;
depositing the second metallization layer on the dielectric layer as a second plate of the third MIM capacitor; and
depositing a sixth trace on the second surface of the substrate and coupled to a second end of the third TSV and a second end of the sixth TSV.

13. The method of claim 12, further comprising depositing a seventh trace on the first surface of the substrate and coupled to a first end of the sixth TSV.

14. The method of claim 10, in which the first trace is coupled to the first end of the third TSV and the third trace.

15. The method of claim 10, in which the substrate comprises alumina.

16. The method of claim 10, further comprising integrating the 3D resonator in an integrated passive device (IPD).

17. The method of claim 16, further comprising integrating the IPD in a broadband filter.

18. The method of claim 17, further comprising integrating the broadband filter in a radio frequency front-end (RFFE) module.

* * * * *